(12) United States Patent
Park

(10) Patent No.: US 9,236,711 B2
(45) Date of Patent: Jan. 12, 2016

(54) METHOD OF MANUFACTURING FREQUENCY TUNABLE TERAHERTZ TRANSCEIVER

(71) Applicant: ELECTRONICS AND TELECOMMUNICATIONS RESEARCH INSTITUTE, Daejeon (KR)

(72) Inventor: Kyung Hyun Park, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 70 days.

(21) Appl. No.: 14/176,838

(22) Filed: Feb. 10, 2014

(65) Prior Publication Data

US 2014/0154822 A1   Jun. 5, 2014

Related U.S. Application Data

(62) Division of application No. 12/987,422, filed on Jan. 10, 2011, now Pat. No. 8,649,414.

(30) Foreign Application Priority Data

Sep. 17, 2010 (KR) .......................... 10-2010-009182

(51) Int. Cl.
| | |
|---|---|
| *H01S 5/10* | (2006.01) |
| *H01S 5/0625* | (2006.01) |
| *G02F 1/35* | (2006.01) |
| *H01S 5/00* | (2006.01) |
| *H01S 5/026* | (2006.01) |
| *H01S 5/042* | (2006.01) |
| *H01S 5/06* | (2006.01) |

(Continued)

(52) U.S. Cl.
CPC ............ *H01S 5/1092* (2013.01); *G02F 1/3534* (2013.01); *H01S 5/06258* (2013.01); *G02F 2203/13* (2013.01); *H01S 5/0092* (2013.01); *H01S 5/026* (2013.01); *H01S 5/0425* (2013.01); *H01S 5/0612* (2013.01); *H01S 5/1096* (2013.01); *H01S 5/12* (2013.01); *H01S 5/1215* (2013.01); *H01S 5/4087* (2013.01)

(58) Field of Classification Search
None
See application file for complete search history.

(56) References Cited

U.S. PATENT DOCUMENTS

| | | | |
|---|---|---|---|
| 7,230,963 B2 | 6/2007 | Menon et al. | |
| 2002/0172464 A1* | 11/2002 | Delwala | B82Y 20/00 385/40 |
| 2004/0013352 A1 | 1/2004 | Khayim et al. | |

(Continued)

FOREIGN PATENT DOCUMENTS

| | | |
|---|---|---|
| JP | 08-172245 A | 7/1996 |
| JP | 2005-315586 A | 11/2005 |

(Continued)

*Primary Examiner* — Seahvosh Nikmanesh
(74) *Attorney, Agent, or Firm* — Rabin & Berdo, P.C.

(57) ABSTRACT

A method of manufacturing a frequency tunable terahertz transceiver including two separate distributed feedback lasers manufactured in one substrate, includes forming a lower clad layer on the substrate, forming an active layer on the lower clad layer, forming an upper clad layer on the active layer. And interposing first and second diffraction grating layers between the upper clad layers. A diffraction grating is manufactured by etching the first and second diffraction grating layers. The active layer is integrated into a passive waveguide. An electrode is formed on the upper clad layer.

11 Claims, 15 Drawing Sheets

(51) Int. Cl.
*H01S 5/12* (2006.01)
*H01S 5/40* (2006.01)

(56) References Cited

U.S. PATENT DOCUMENTS

| 2006/0062519 | A1 | 3/2006 | Kish et al. | |
|---|---|---|---|---|
| 2007/0153858 | A1* | 7/2007 | Kim et al. | 372/50.1 |
| 2009/0180499 | A1 | 7/2009 | Wiedmann et al. | |
| 2010/0142571 | A1 | 6/2010 | Park et al. | |
| 2010/0277726 | A1 | 11/2010 | Logan, Jr. et al. | |

FOREIGN PATENT DOCUMENTS

| JP | 2007250889 A | 9/2007 |
|---|---|---|
| KR | 2008-0096634 A | 10/2008 |
| KR | 2009-0092143 A | 8/2009 |
| KR | 2009-0120254 A | 11/2009 |

* cited by examiner

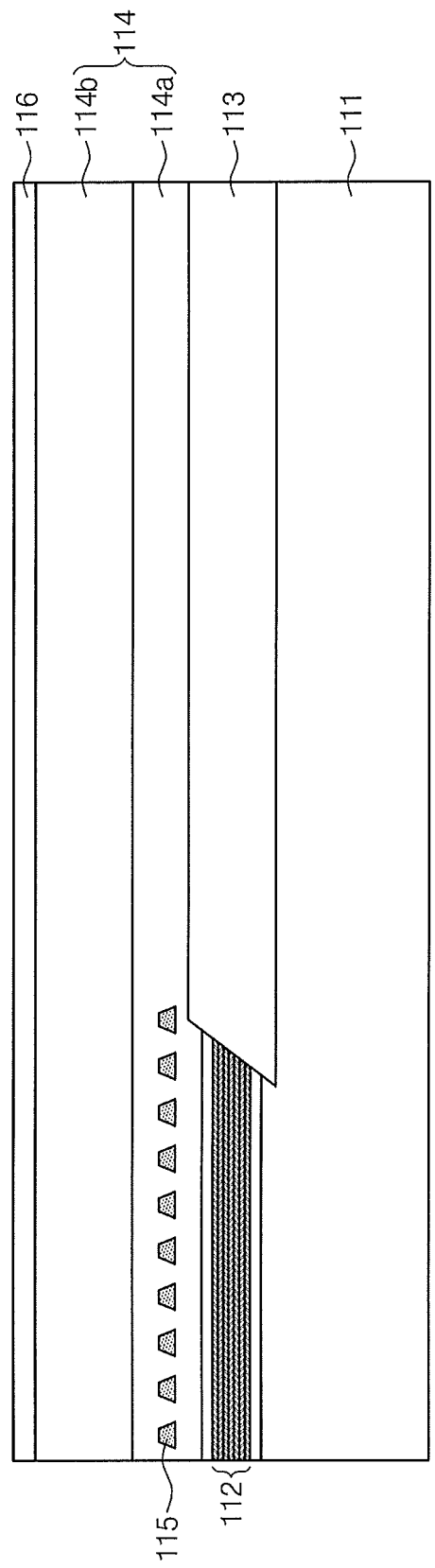

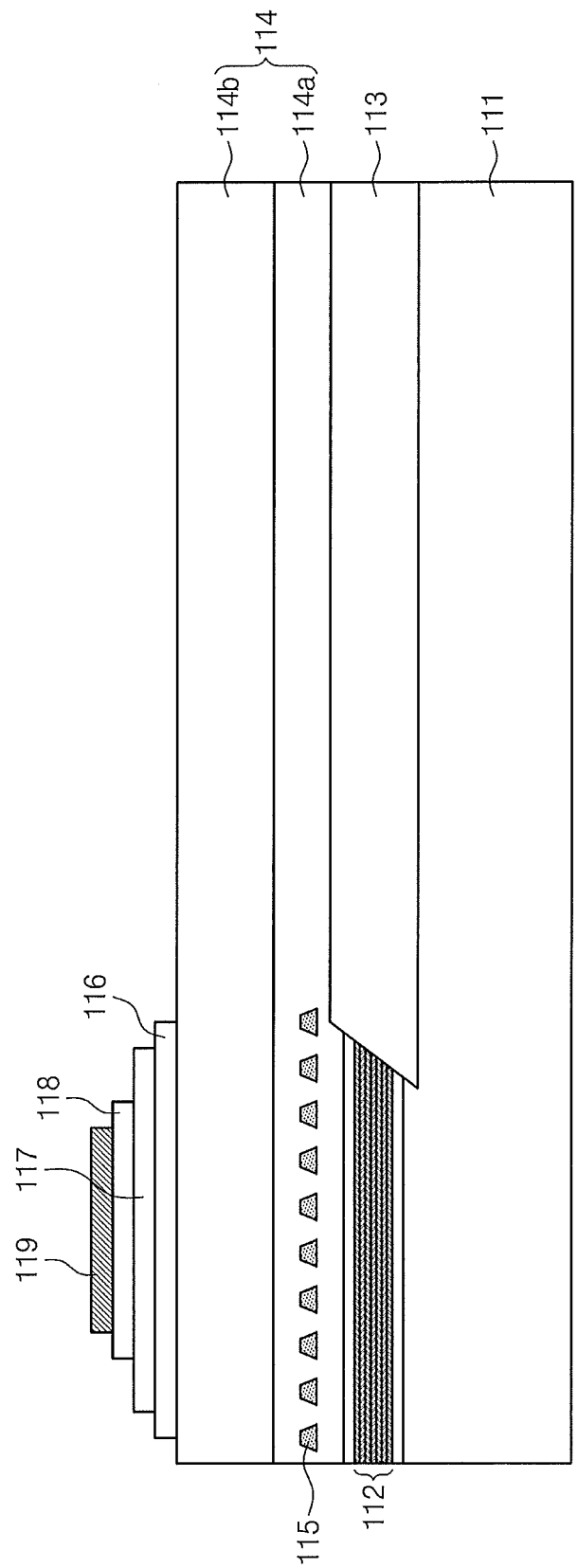

METHOD OF MANUFACTURING FREQUENCY TUNABLE TERAHERTZ TRANSCEIVER

CROSS-REFERENCE TO RELATED APPLICATIONS

This application is a divisional of co-pending application Ser. No. 12/987,422 filed on Jan. 10, 2011, and claims priority under 35 U.S.C. §119 of Korean Patent Application No. 10-2010-0091821, filed on Sep. 17, 2010, the disclosure of which are hereby incorporated by reference.

BACKGROUND OF THE INVENTION

The present invention disclosed herein relates to a frequency tunable terahertz transceiver and a method of manufacturing a dual wavelength laser.

A terahertz band (i.e., 0.1 THz to 3 THz) may have a property that transmits nonmetal and nonpolar materials. Furthermore, since a resonant frequency of various kinds of molecules spreads over a terahertz band, by identifying the molecules in real-time through a nondestructive, unopened, and non-contact method, it is expected that unprecedented analytical techniques of new concept will be provided for medical care, medical science, agricultural food, environmental measurement, bio, and advanced material evaluation. Accordingly, in relation to a terahertz wave, its wide variety of applications expand rapidly. The terahertz wave does not affect the human body because of its very low energy of several meV and its demand as essential core technology for realizing human-centered ubiquitous society is drastically increased. However, techniques satisfying real-time, portable and low cost simultaneously have not developed yet.

As a terahertz generating method currently being used, there are diverse techniques such as a frequency doubling technique, a backward wave oscillator, a photomixing technique, a $CO_2$ pumped gas laser, a quantum cascade laser, and a free electron laser. Many studies in development of a wave source operating in a frequency band of 0.1 THz to 10 THz, called a THZ gap region, are in progress but an appropriate wave source technique satisfying ultra-micro, uncooled, and high-output conditions necessary for commercialization is not mature until now. Moreover, there is no technique for turning a terahertz wave at high speed in a broad frequency band. If it is possible for a terahertz wave to vary at high speed in a broad frequency band, various physical phenomena may be monitored in real-time in a terahertz band.

A terahertz device being used most widely until now is a time domain spectroscopy device that projects a femtosecond-level ultra short pulse laser on a semiconductor-based photoconductive antenna having a high-speed response rate to generate and detect terahertz waves. The terahertz device consisting of a femtosecond-level pulse laser and a photoconductive antenna provides a high signal to noise ratio (SNR) but requires a femtosecond-level pulse laser and very accurate optical device. Therefore, in terms of price and size, there are several limitations in developing a terahertz device as a measuring instrument of a portable concept.

SUMMARY OF THE INVENTION

The present invention provides a frequency tunable terahertz transceiver having a micro-sized dual wavelength laser and a method of manufacturing a dual wavelength laser.

Embodiments of the present invention provide frequency tunable terahertz transceivers including: a dual wavelength laser including two distributed feedback lasers that are manufactured in one substrate and output optical signals of respectively different wavelengths; and an optical device receiving the outputted optical signals to generate a terahertz wave.

In some embodiments, each of the distributed feedback lasers may include: an active layer generating an optical signal; a bragg diffraction grating coupled to the active layer and oscillating the generated optical signal according to an effective refractive index; and a passive waveguide outputting the optical signal from the active layer into the optical device.

In other embodiments, the frequency tunable terahertz transceivers may further include a microheater controlling the effective refractive index.

In still other embodiments, the frequency tunable terahertz transceivers may further include a thermal diffusion preventing region between the distributed feedback lasers to locally control the effective refractive index of each of the distributed feedback lasers by using the microheater.

In even other embodiments, an optical signal outputted from an active layer of each of the distributed feedback lasers may be outputted through one passive waveguide.

In yet other embodiments, an optical signal outputted from an active layer of each of the distributed feedback lasers may be outputted through a corresponding passive waveguide.

In further embodiments, the passive waveguides of the distributed feedback lasers may be tilted 9° with respect to each other to lower a sectional reflectance and increase optical coupling efficiency.

In still further embodiments, each of the distributed feedback lasers may further include a high reflection layer or an antireflection layer to control a sectional reflectance.

In even further embodiments, the active layer and the passive waveguide may be coupled through butt coupling.

In yet further embodiments, a coupling angle may be adjusted to control an internal reflectance occurring at a section between the active layer and the passive waveguide.

In yet further embodiments, the passive waveguide may have a straight line and band shape.

In yet further embodiments, the optical device may include: a lens coupling the optical signals outputted from the dual wavelength laser; and a photomixer receiving the coupled optical signals to generate the terahertz wave.

In yet further embodiments, the photomixer may detect a terahertz wave inputted from the external.

In other embodiments of the present invention, frequency tunable terahertz transceivers include: a dual wavelength laser including two distributed feedback lasers that are manufactured in one substrate and output optical signals of respectively different wavelengths; an optical device receiving the outputted optical signals to generate a terahertz wave or detecting a terahertz wave inputted from the external; and an analog to digital converter converting the terahertz wave detected from the optical device into a digital signal.

In some embodiments, the optical device may include: a lens coupling the outputted optical signals; a first photomixer receiving the coupled signals of the lens to generate a terahertz wave; and a second photomixer detecting a terahertz wave inputted from the external.

In still other embodiments of the present invention, methods of manufacturing a frequency tunable terahertz transceiver including two separate distributed feedback lasers that are manufactured in one substrate include: forming a lower clad layer on the substrate, interposing a lower diffraction grating layer between the lower clad layers, forming an active layer on the lower clad layer, forming an upper clad layer on the active layer, and interposing an upper diffraction grating layer between the upper clad layers; manufacturing a diffraction grating by etching the lower diffraction grating layer and the lower diffraction grating layer; integrating the active layer into a passive waveguide; and forming an electrode on the upper clad layer.

In some embodiments, the methods may further include: forming a first separate confinement hetero layer having a smaller band gap wavelength than the active layer between the active layer and the upper clad layer; and forming a second separate confinement hetero layer having a smaller band gap wavelength than the active layer between the active layer and the lower clad layer.

In other embodiments, the methods may further include, after the manufacturing of the diffraction grating through a holography and an electron beam lithography, performing a planarization process by re-growing the same material as the upper clad layer on the diffraction grating.

In still other embodiments, the methods may further include, after the integrating of the passive waveguide, growing a p-type semiconductor layer on the upper clad layer.

In even other embodiments, the forming of the electrode may include: forming a lower electrode on the p-type semiconductor layer; forming an insulation layer on the lower electrode; and manufacturing a microheater on the insulation layer through a lithography technique.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIGS. 10 through 15 are views illustrating a method of manufacturing the dual wavelength laser of FIG. 9.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Hereinafter, it will be described about an exemplary embodiment of the present invention in conjunction with the accompanying drawings.

Figure 1:
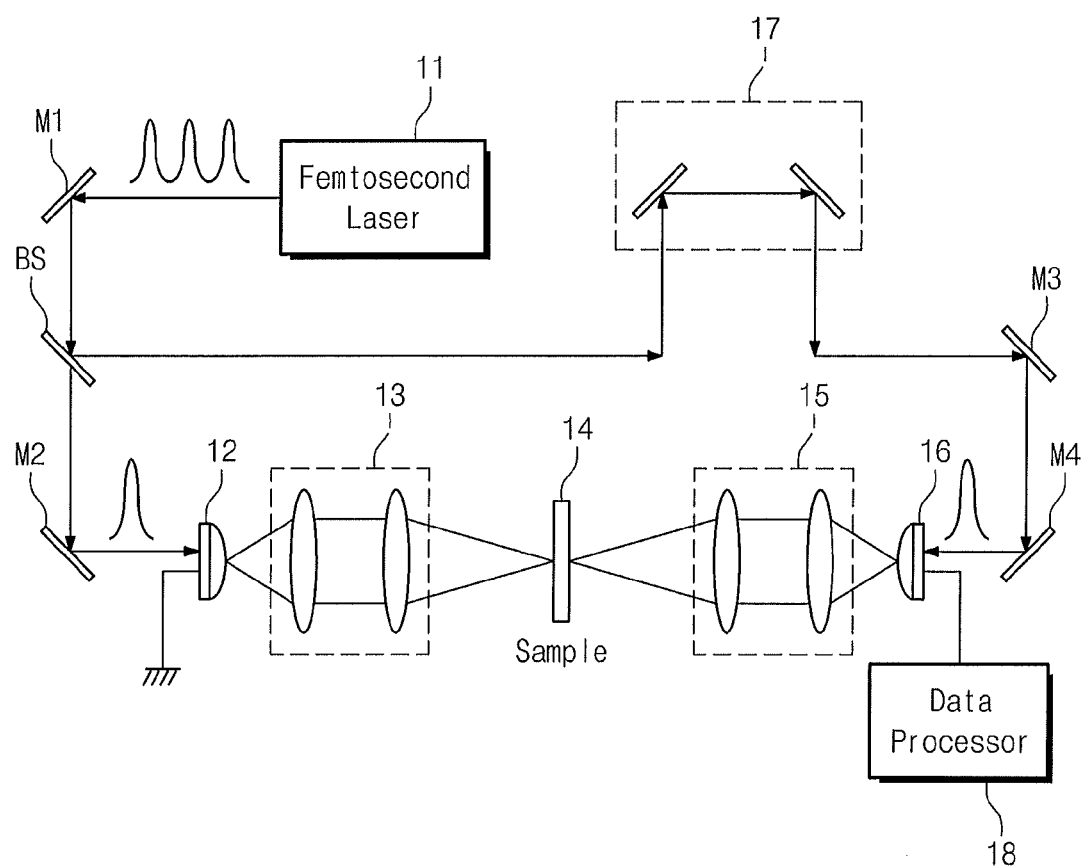
FIG. 1 is a view illustrating a typical time domain spectroscopy system exemplarily.
Figure 2:
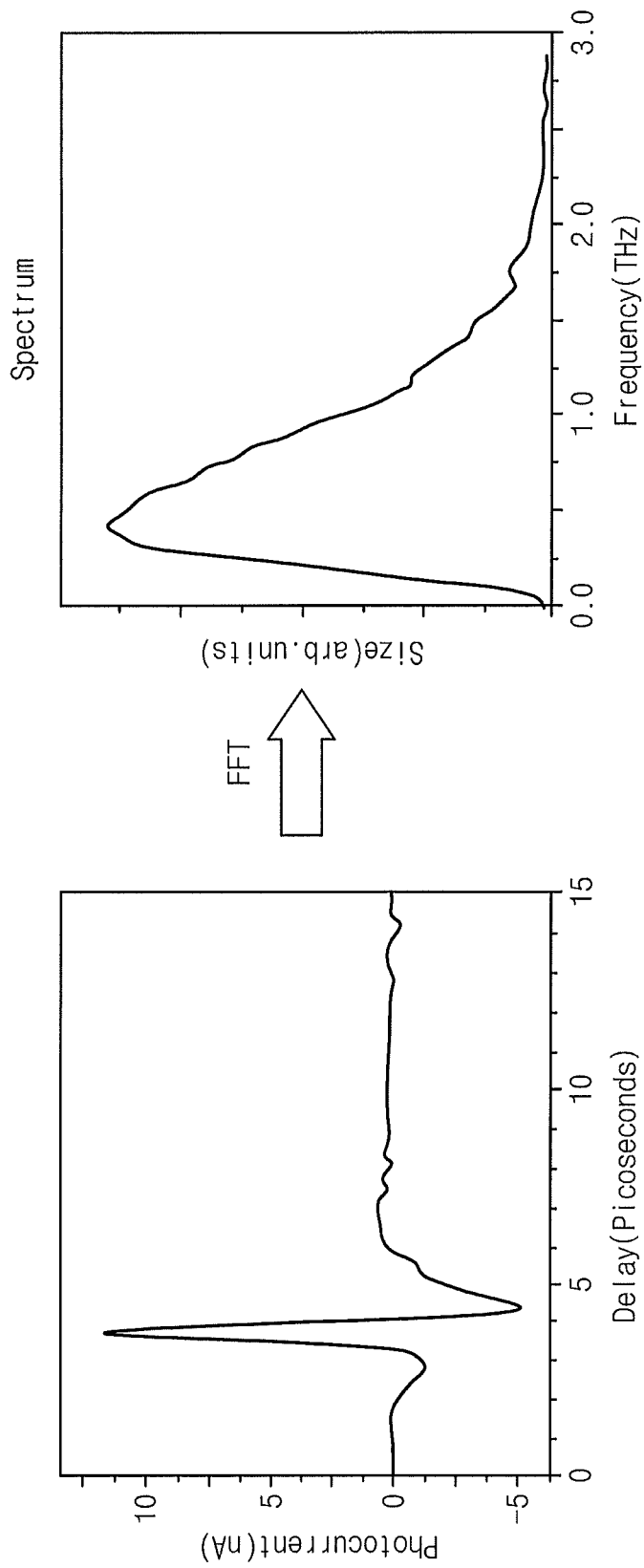
FIG. 2 is a view illustrating data obtained from the time domain spectroscopy system of FIG. 1.

FIG. 1 is a view illustrating a typical time domain spectroscopy system 10 exemplarily. FIG. 2 is a view illustrating data obtained from the time domain spectroscopy system 10 of FIG. 1. Referring to FIGS. 1 and 2, the time domain spectroscopy system 10 generates/detects terahertz waves using a femtosecond laser 11. The time domain spectroscopy system 10 may obtain a high signal to noise ratio (SNR) using a homodyne detection method obtaining data only during femtosecond-level gating time.

An optical signal outputted from the femtosecond laser 11 changes its path by a first mirror M1. The optical signal of the femtosecond laser 11 reflected from the first mirror M1 is divided into two by a beam splitter BS. Here, the divided one optical signal is incident to a terahertz wave generator 12 through a second mirror M2. Moreover, the divided remaining optical signal is incident to a terahertz wave detector 16 with an appropriate time delay.

The terahertz wave generator 12 generates a terahertz wave using the optical signal incident from the second mirror M2. The terahertz wave generated from the terahertz wave generator 12 is focused on a sample 14 through a first focusing lens 13. Moreover, the terahertz wave passing through the sample 14 is incident to a terahertz wave detector 16 through a second focusing lens 15. According to an embodiment, the terahertz wave generator 12 may be a photoconductive antenna.

A terahertz wave detector 16 detects a terahertz wave using an optical signal incident from a fourth mirror M4. According to an embodiment, the terahertz wave detector 16 may be a photoconductive antenna. Time delay may be obtained using a delay line 17. An output signal of the delay line 17 is incident to the terahertz wave detector 16 through a third mirror M3 and a fourth mirror M4. The terahertz wave detector 16 generates electrical signals depending on time delay.

A dada processor 18 obtains an electrical signal of the terahertz wave detector 16. That is, the data processor 18 obtains delay time dependable data from the terahertz wave detector 16, and performs the fast fourier transform on the data to obtain the spectrum of a terahertz wave. According to an embodiment, the data processor 18 may be a high-speed A/D converter or a high-speed oscilloscope.

Referring to FIG. 2, an electrical signal according to time delay is FFT-converted to provide the spectrum of a terahertz wave. In the time domain spectroscopy system 10, the optical devices 12 and 16 generating and detecting a terahertz wave may relatively easily generate a terahertz wave due to occurrence of electromagnetic waves caused from acceleration of a carrier created by irradiating an optical signal, generated from the femtosecond laser 11, on a semiconductor. The time domain spectroscopy system 10 may obtain a high SNR by using a homodyne detection method with respect to femtosecond-level gating time.

As mentioned above, the time domain spectroscopy system 10 divides the optical signal generated from the femtosecond laser 11 of an oscillation wavelength having an 800 nm band into two and uses them. For example, one is incident to the terahertz wave generator 12 to generate a terahertz wave and the other is incident into the terahertz wave detector 16 with an appropriate time delay.

However, the time domain spectroscopy system 10 cannot avoid the time delay in data processing because information corresponding to the time delay needs to be collected and the FFT needs to be performed on the collected information in order for actual application of a terahertz wave. Accordingly, the time domain spectroscopy system 10 is limited to the development of a terahertz wave source of a real-time concept besides its size and high cost.

Since a frequency domain (FD) based spectroscopy system resolves the limitations of a terahertz time domain based spectroscopy system, its demand is expected to be increased in a wide variety of application fields such as detection of hazardous substances, measurement of new material properties, and freshness measurement of agricultural and marine products through a molecular fingerprinting analysis.

Unlike the time domain spectroscopy system 10 of FIGS. 1 and 2, the FD spectroscopy system integrates two high-output frequency tunable lasers having respectively different wavelengths into on a semiconductor substrate having a high-speed response time and irradiates outputted optical signals into a photomixer having a voltage applied, thereby generating a frequency tunable terahertz wave.

Figure 3:
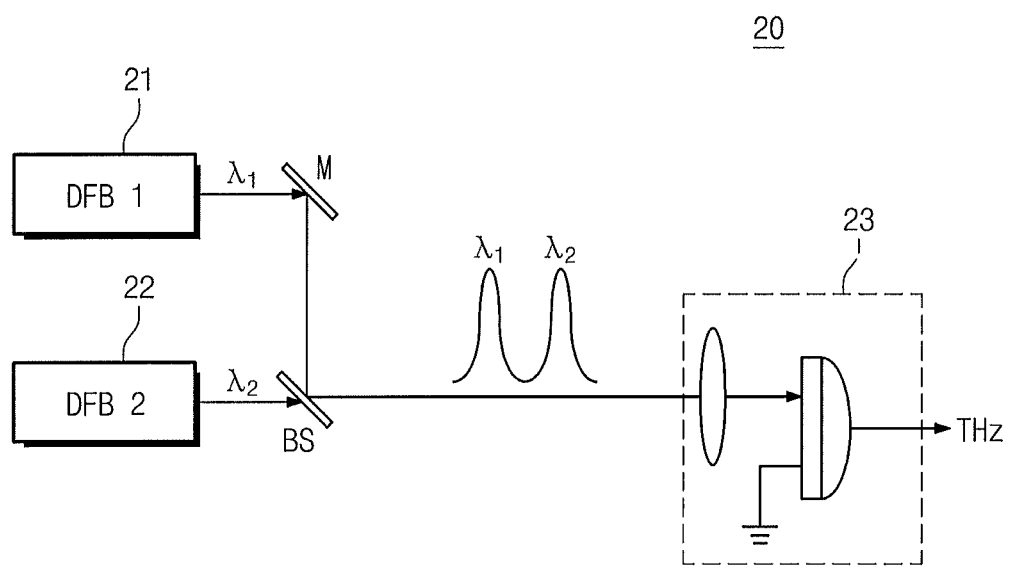
FIG. 3 is a view illustrating an FD spectroscopy system exemplarily.

FIG. 3 is a view illustrating an FD spectroscopy system 20 exemplarily. Referring to FIG. 3, the FD spectroscopy system 20 virtually does not need the high-cost femtosecond laser 11 of FIG. 1 that the time domain spectroscopy system 10 of FIG. 1 requires. Therefore, since the FD spectroscopy system 20 uses a low manufacturing cost and ultra-micro semiconductor layer, developing a very compact terahertz wave generating system becomes possible.

However, the FD spectroscopy system 20 generates terahertz waves according to beating of oscillation lights of the two lasers 21 and 22, such that the maximum power of beating becomes drastically low compared to the time domain spectroscopy system 10. Due to this, the FD spectroscopy system 20 has a low output of a terahertz wave. Furthermore, the FD spectroscopy system 20 needs to use a thermally stable photomixer 23 because of continuous wave injection.

Moreover, the FD spectroscopy system 20 needs to include a photoconductive switch in the photomixer 23, which is formed of a material absorbing excitation light's wavelength effectively. In case of a long-wavelength, InP is used as the absorbing material and in case of a short-wavelength of a 0.8 µm band, GaAS is used as the absorbing material.

However, a band gap of the InP semiconductor is less than that of the GaAs semiconductor. Because of this, controlling dark current accurately is required. In terms of a photomixer, the InP semiconductor has many disadvantages compared to the GaAs semiconductor but is possible to be directly used for optical devices for optical communication such as an optical amplifier, a laser, a switch, and a filter. Therefore, its researches are actively in progress. The reasons for putting much effort on a long-wavelength photomixer development are because it may easily utilize components of all functions developed for communications with a low cost and also may be used for developing a network-based terahertz communication system.

The FD spectroscopy system 20 includes a generator and a detector and the entire system's efficiency is determined by a SNR of a terahertz wave generator and detector. At this point, a low output of the generator may be sufficiently resolved by high sensitivity of the detector. An output of a terahertz wave is satisfied with the following Equation 1.

$$P_{THz} = 2(I_o)^2 R_A \frac{mP_1 P_2}{P_0^2 [1+(\omega\tau)^2][1+(\omega R_A C)^2]} \quad \text{[Equation 1]}$$

Here, m is an inter-mode overlap index, $P_1$ and $P_2$ represent optical outputs of each, $I_o$ represents dc photocurrent, $R_A$ represents radiation resistance of an antenna, c and τ represent capacitance and charge lifetime, and ω represents mixing efficiency of two beams.

In order for generating highly efficient terahertz waves, variables affecting a high output light source and photoelectric conversion efficiency of a photomixer need to be adjusted. As expressed in the above Equation 1, photoelectric conversion efficiency of the photomixer 23 is affected by its high response speed, antennal resistance, and a mixing rate of light source.

During generating of continuous frequency tunable terahertz waves, the frequency f of the terahertz wave and a difference Δλ between two oscillation wavelengths of an excitation light source have a relationship of $f=c\Delta\lambda/\lambda^2$. Here, the frequency f of a terahertz wave is determined according to a difference of frequencies $f_1=c/\lambda_1$ and $f_2=c/\lambda_2$ corresponding to oscillation wavelengths $\lambda_1$ and $\lambda_2$ in two separate lasers 21 and 22 of an excitation light.

In a technique of generating frequency tunable terahertz waves, a wavelength tunable property of an excitation light source is very important. Obtaining wavelength tunable properties of 8 nm/1 THz and 5.6 nm/1 THz is necessary in 1.5 µm and 1.3 µm wavelength regions, respectively. For this, a laser having a large oscillation wavelength difference between modes needs to be developed.

When a long-wavelength excitation light source is used, it is important to obtain a broad tunable range with respect to an oscillation wavelength difference of an excitation light source. Moreover, when a 0.8 µm short-wavelength is used, controlling a terahertz frequency where terahertz wave occurrence is possible in a very narrow wavelength difference is important. In a wavelength division multiplexer (WDM) based optical communication system, there are many limitations in generating terahertz waves using a wavelength tunable laser, which is important and expensive.

Generally, a full width half maximum (FWHM) of an oscillation wavelength uses two kHz-level separate wavelength tunable lasers to provide a wideband wavelength tunable characteristic and a very narrow oscillation wavelength line width. However, due to instability of each oscillated wavelength and polarization control between wavelengths and limiting factors according to packaging, the system is significantly expensive.

In order to overcome these system limitations, a dual bragg diffraction grating may be inserted into a single resonator and a microheater may be integrated on an area of dual mode laser oscillation and its distributed feedback (DFB).

Figure 4:
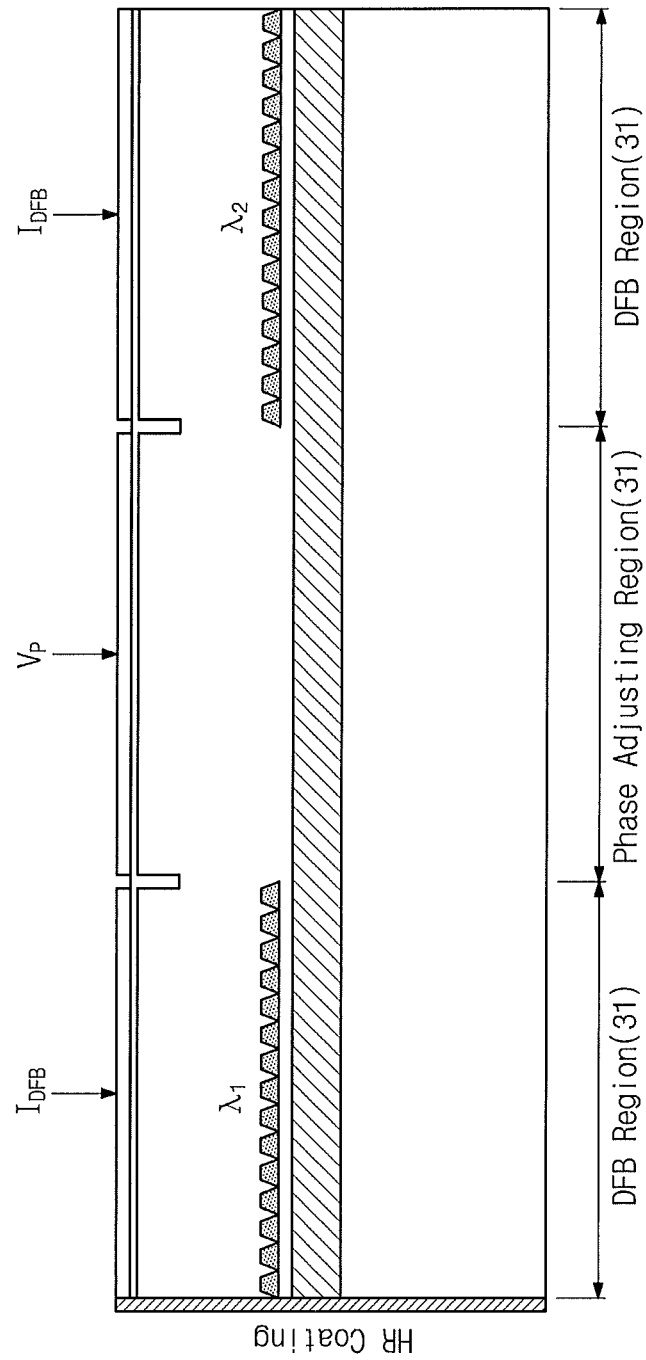
FIG. 4 is a view illustrating a microheater integrated-type dual mode layer.

FIG. 4 is a view illustrating a microheater integrated-type dual mode layer 30. Referring to FIG. 4, the microheater integrated-type dual mode layer 30 includes a first DFB region 31, a second DFB region 32, and a phase adjusting region 33.

As shown in FIG. 4, in order to obtain a wideband beating source and stable dual mode oscillation of the microheater integrated-type dual mode layer 30, reverse voltage Vp is applied to the phase adjusting region 33. Accordingly, because of internal damage occurring when the wavelength $\lambda_1$ oscillating in the first DFB region 31 passes through the phase adjusting region 33, it is difficult to develop a dual mode laser of a high output. In order to resolve this efficiently, an amplifier may be integrated. However, amplified spontaneous emission (ASE) noise accumulation needs to be resolved.

In relation to important variables of a beating source for terahertz wave oscillation, each oscillation wavelength stability needs to be about −140 dB/Hz and, when a side mode suppression ratio (SMSR) is more than 40 dB, a polarization state of each light source needs to be equal. An interval between each oscillation optical output and two wavelengths needs to be easily changed.

Accordingly, according to the present invention, two separate DFB lasers with an integrated microheater are constituted as one chip and a frequency tunable terahertz transceiver using the one chip as a beating source is provided.

Figure 5:
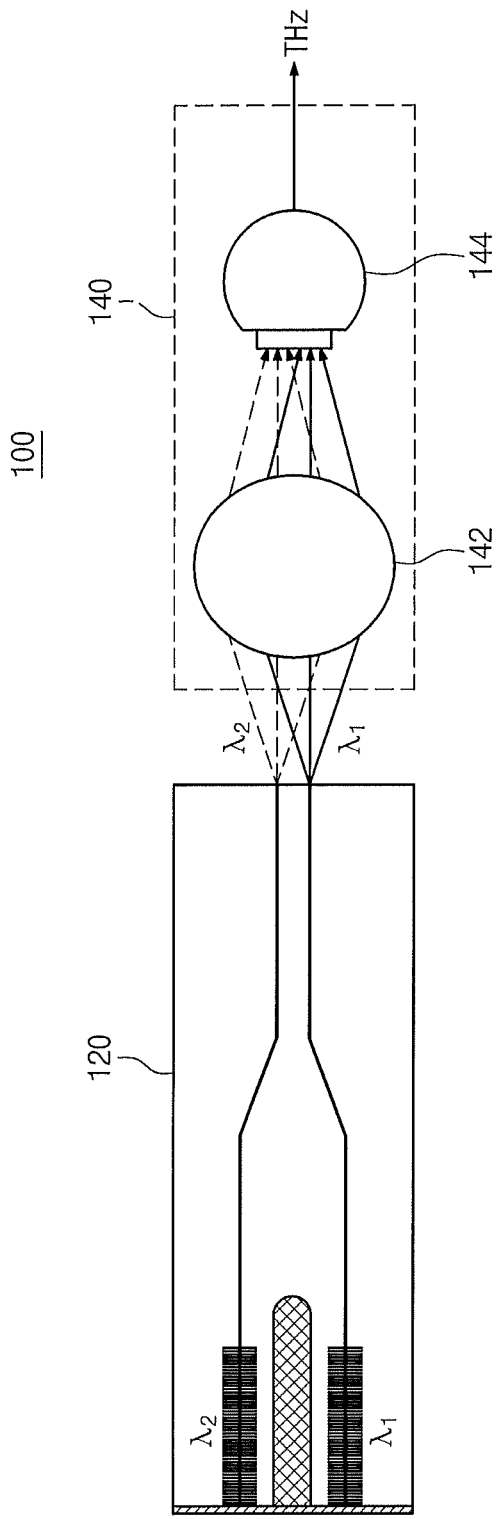
FIG. 5 is a view illustrating a frequency tunable terahertz transceiver according to an embodiment of the present invention.

FIG. 5 is a view illustrating a frequency tunable terahertz transceiver 100 according to an embodiment of the present invention. Referring to FIG. 5, the frequency tunable terahertz transceiver 100 includes a dual wavelength laser 120 and an optical device 140.

The dual wavelength laser 120 includes two separate DFB lasers on one substrate. The dual wavelength laser 120 is driven as an integrated single device but does not require a compound cavity mode control kike a single resonator and may be used for easily developing a wideband beating source of a high output.

The optical device 140 directly combines optical outputs $\lambda_1$ and $\lambda_2$ using an arbitrary-shaped lens 142 as shown in FIG. 5, and directly irradiates the combined optical outputs $\lambda_1$ and $\lambda_2$ on the photomixer 144 to generate a terahertz wave. Moreover, the optical device 140 is adjustable to maximize optical combination.

The frequency tunable terahertz transceiver 100 according to an embodiment of the present invention realizes two DFB lasers in one chip and includes the optical device 140 realized with a variety of optical combination configuration, so that it may be manufactured ultra-compact.

Figure 6:
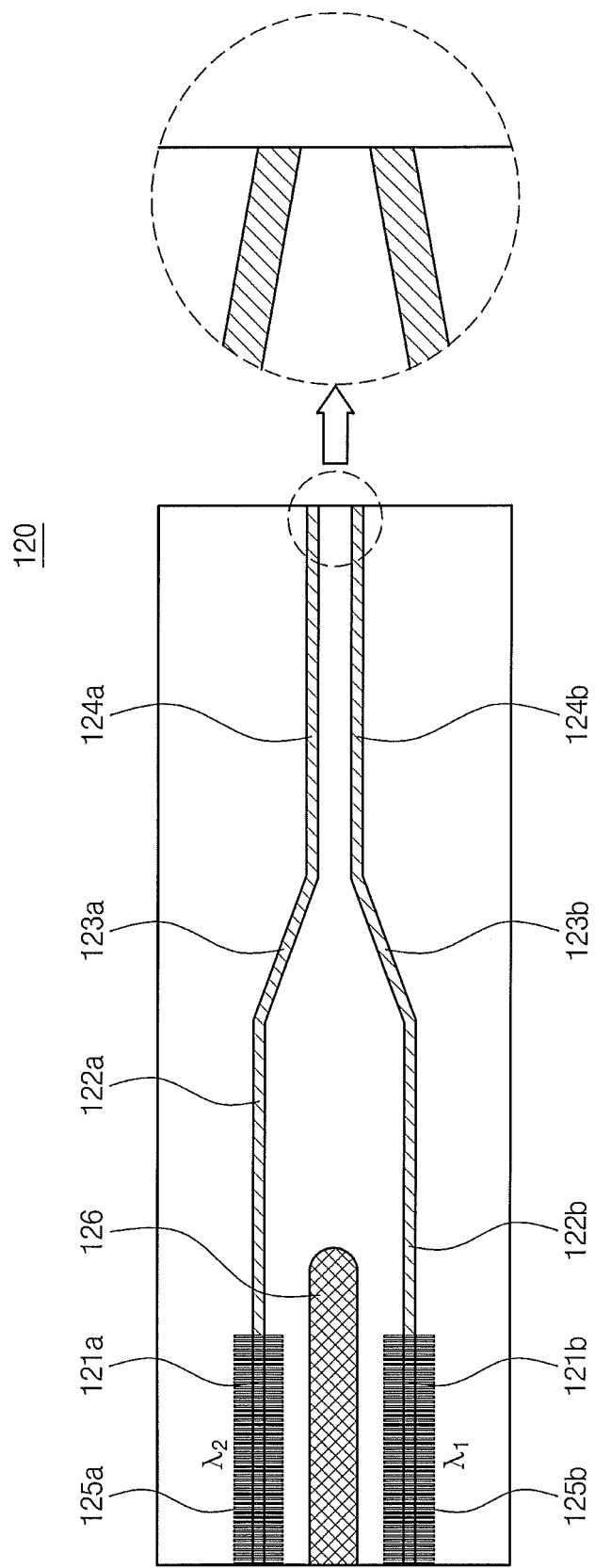
FIG. 6 is an enlarged view of the dual wavelength laser of FIG. 5.

FIG. 6 is an enlarged view of the dual wavelength laser 120 of FIG. 5. Referring to FIG. 6, the dual wavelength laser 120 includes first and second active layers 121a and 121b, first and second passive waveguides 122a, 123a, 124a and 122b, 123b, 124b, first and second bragg diffraction gratings 125a and 125b, and a thermal diffusion preventing region 126.

The first active layer 121a generates a predetermined optical signal $\lambda_1$ and has a quantum well structure for providing gain. The second active layer 121b generates a predetermined optical signal $\lambda_2$ and has a quantum well structure for providing gain. The first active layer 121a and the second active layer 121b are the same multiple quantum well (MQW) layer during crystal growth and the first and second passive waveguides 122a, 123a, 124a and 122b, 123b, 124b share the same layer designed as a waveguide layer during crystal growth. Processes of manufacturing the device are the same as those of manufacturing a passive waveguide combined laser diode having a buried hetero structure (BH).

The first passive waveguides 122a, 123a, and 124a output an optical signal $\lambda_1$ outputted from the first active layer 121a to the external (e.g., the optical device 140 of FIG. 5). The first passive waveguides 122a, 123a, and 124a have a straight and band structure. The second passive waveguides 122b, 123b, and 124b output an optical signal $\lambda_2$ outputted from the second active layer 121b to the external.

The first bragg diffraction grating 125a is coupled to the first active layer 121a and oscillates the optical signal $\lambda_1$ according to a first effective refractive index. Here, the first effective refractive index is controlled by a microheater (not shown).

The second bragg diffraction grating 125b is coupled to the second active layer 121b and oscillates the optical signal $\lambda_2$ according to a second effective refractive index. Here, the second effective refractive index is controlled by a microheater (not shown).

The thermal diffusion preventing region 126 is formed between the first bragg diffraction grating 125a and the second bragg diffraction grating 125b so as to locally control effective refractive indices of the first and second bragg diffraction gratings 125a and 125b using a microheater. In order for obtaining thermal stability and preventing thermal diffusion, a deeper etch depth than the active layer is required and a curved shape is utilized to prevent damage during chip formation.

Although not shown in FIG. 6, the dual wavelength laser 120 may further include an electrode for injecting current from the microheater to the active layers 121a and 121b using two separate lasers and a high-reflection (HR) or antireflection (AR) nitride layer for adjusting sectional reflectance.

Each of DFB lasers of the dual wavelength laser 120 shown in FIG. 6 is separated in corresponding passive waveguides. However, the present invention is not limited thereto. The DFB lasers of a dual wavelength laser according to an embodiment of the present invention may include respectively combined passive waveguides.

Figure 7:
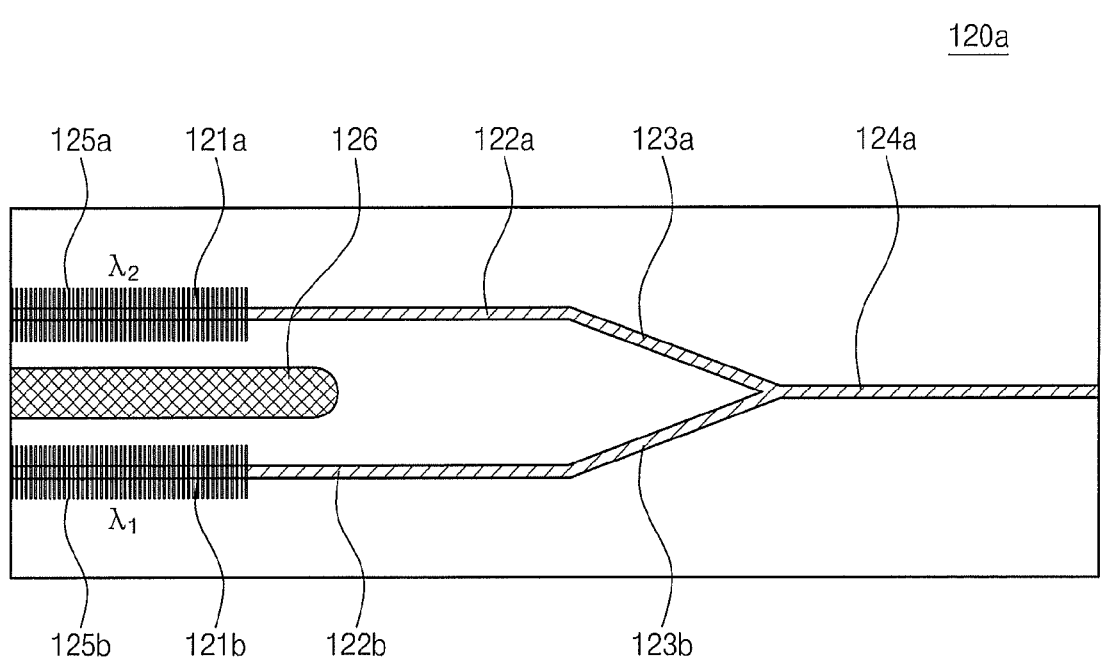
FIG. 7 is a view illustrating a dual wavelength laser with an integrated 1×2 combiner according to another embodiment of the present invention.

FIG. 7 is a view illustrating a dual wavelength laser 120a with an integrated 1×2 combiner according to another embodiment of the present invention. Referring to FIG. 7, the dual wavelength laser 120a includes a 1×2 combiner 124. According to an embodiment, the 1×2 combiner 124 may be a 1×2 multimode interface (MMI) combiner.

The dual wavelength laser 120a may be combined with an optical fiber instead of the lens 142 of FIG. 5 in the space so that is may be integrated into one module. That is, a terahertz transceiver integrated into one mode may be developed. This terahertz transceiver is necessary to control 3 dB optical loss and internal reflection occurring at a diverging point due to the 1×2 optical coupler adoption.

Referring to the above-mentioned Equation 1 again, setting the inter-mode overlap index m as 1 is the most advantageous to the internal reflection control. While the dual wavelength laser 120b and the single resonator beating source of FIG. 7 are used, when the first and second passive waveguides 122a, 123a, 124a and 122b, 123b, 124b and the lens 142 of FIG. 5 are realized to allow the overlap index m to be 1, the overlap index m needs to be the maximum. Due to this, besides of the design of the optical device 140, directions of the first and second passive waveguides 122a, 123a, 124a and 122b, 123b, 124b and an angle of the chip section need to be adjusted.

In an embodiment, by adjusting an angle of the waveguide, a sectional reflectance is drastically decreased and optical coupling efficiency is maximized In an embodiment, in order to obtain sectional reflectance, the passive waveguide 124a or 124b may be formed tilted with 7°.

The frequency tunable terahertz transceiver of FIG. 6 includes one photomixer 142 having a terahertz wave generator and a terahertz wave detector. However, the present invention is not limited thereto. A frequency tunable terahertz transceiver according to an embodiment of the present invention may include at least one photomixer having a terahertz wave generator and at least one photomixer having a terahertz wave detector.

Furthermore, when a terahertz wave is detected using a photomixer, some beam may be restricted in order for phase adjustment between the terahertz wave generator and the terahertz wave detector. For this, an appropriate optical device and optical fiber may be used.

Figure 8:
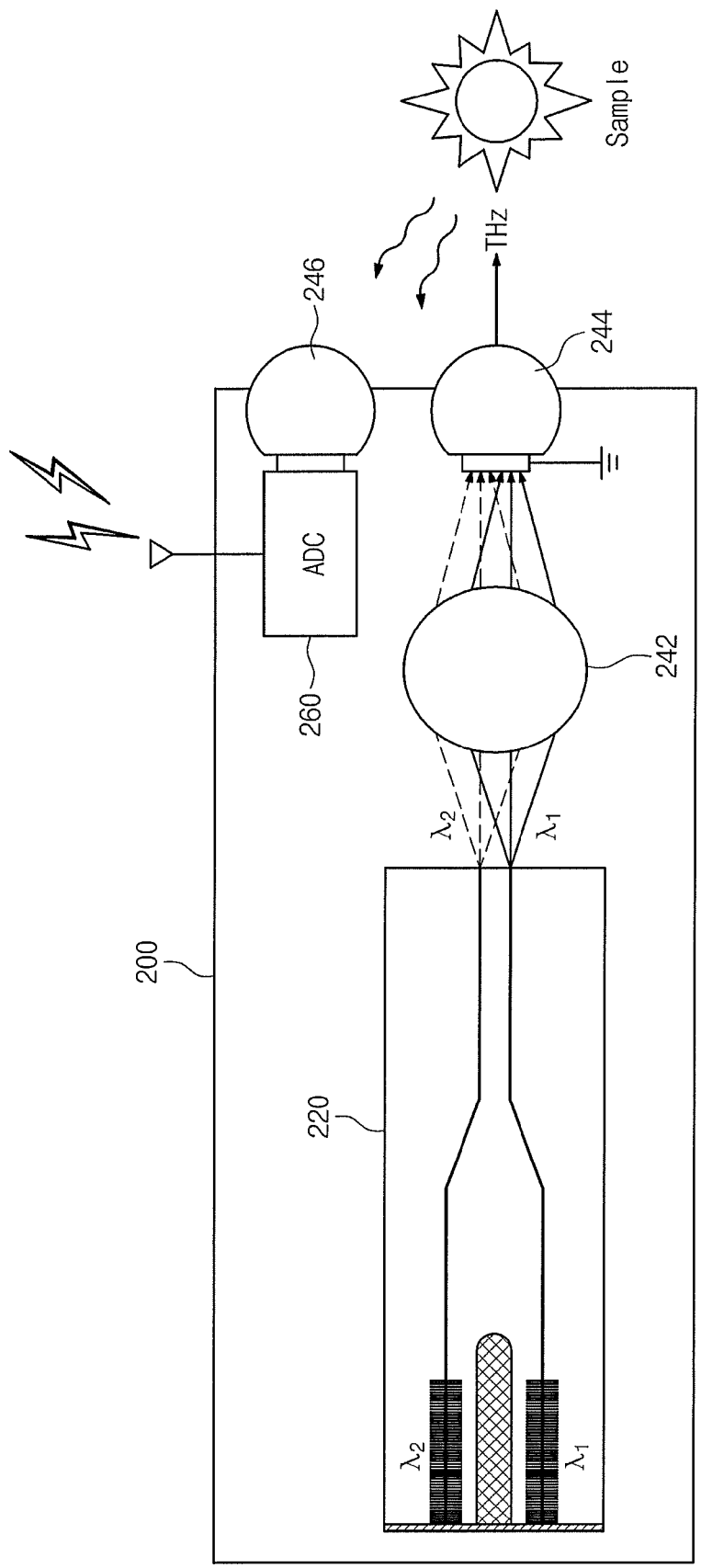
FIG. 8 is a view illustrating a terahertz transceiver according to a second embodiment of the present invention.

FIG. 8 is a view illustrating a terahertz transceiver 200 according to a second embodiment of the present invention. Referring to FIG. 8, the terahertz transceiver 200 includes a micro-sized dual mode laser 220 and uses it as a beating source. Also, the terahertz transceiver 200 uses a proper optical device for inducing effective optical coupling with the beating source in a photomixer 244 and physically combines a high resistance silicon lens 242 for detecting a generated terahertz wave with the photomixer 244.

A detection operation of the terahertz transceiver 200 according to an embodiment of the present invention proceeds as follows. A modulated light source is easily obtained by modulating the laser drive in one region of an oscillation wavelength $I_1$ or $I_2$ in the dual wavelength laser 220 as a light source unit. From this, a frequency tunable terahertz transceiver may be developed.

The terahertz transceiver 200 according to an embodiment of the present invention obtains a modulated light source of a high speed with an injection current modulation and measures induction and detection of terahertz wave occurrence modulated from that using one module. Also, the terahertz transceiver 200 processes the obtained optical signal digitally, delivers the digital information through communication, and directly transfers to a sample to be measured to detect a terahertz wave.

Moreover, the terahertz transceiver 200 according to an embodiment of the present invention may realize a stand-off technique with a battery-powered high efficiency.

Figure 9:
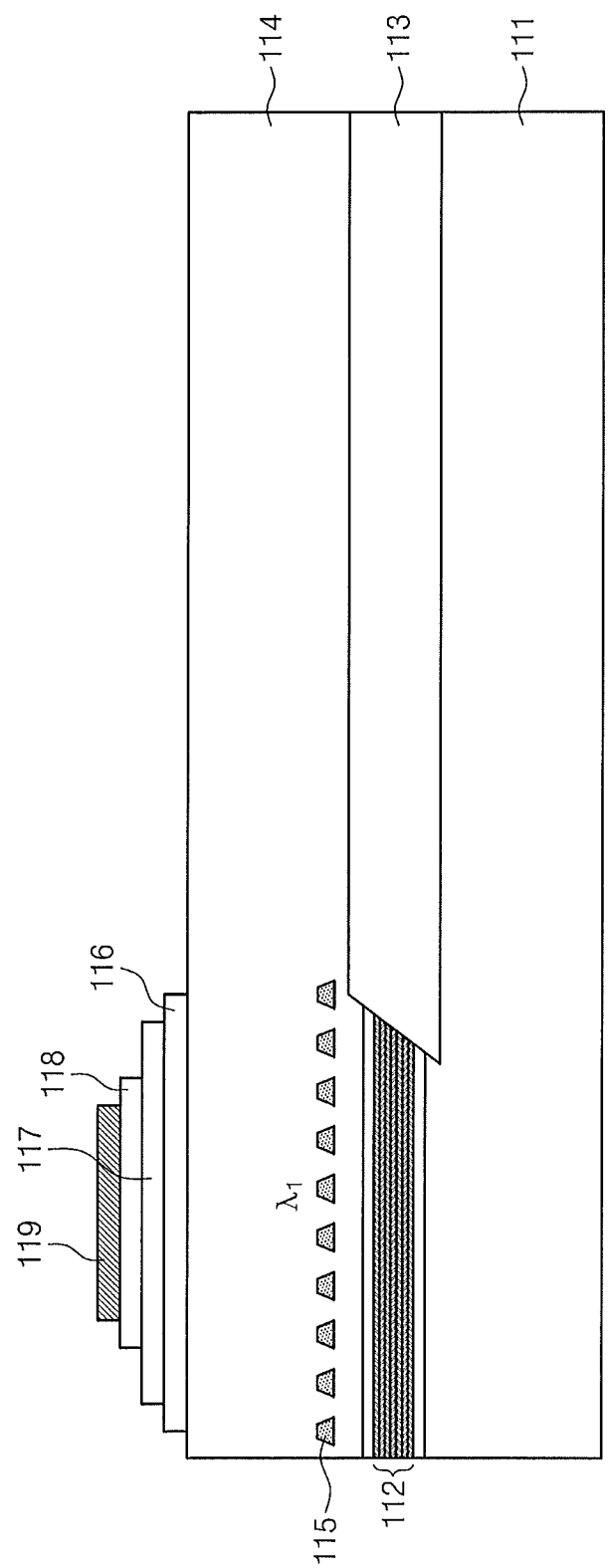
FIG. 9 is a view illustrating a side of a dual wavelength laser exemplarily according to an embodiment of the present invention.

FIG. 9 is a view illustrating a side of a dual wavelength laser exemplarily according to an embodiment of the present invention. For convenience of description, it is assumed below that the dual wavelength laser is illustrated with a section of a part (e.g. a DFB laser) of the dual wavelength laser 120 of FIG. 6. Referring to FIG. 9, the dual wavelength laser includes a lower clad layer 111, an active laser 112 or 121b of FIG. 6, a passive waveguide 113 or 122b of FIG. 6, an upper clad layer 114, a diffraction grating 115 or 125b of FIG. 6, a p-type InGaAs layer 116, a lower electrode 117, an insulation layer 118, and a microheater 119. Moreover, the diffraction grating 115 may be symmetrically interposed below the lower cladding layer 114 as shown in FIG. 9. The position of the diffraction grating below or on the active layer 112 may be selected during device manufacturing processes. In an embodiment, the upper diffraction grating may be a loss-coupled diffraction grating. Based on the kinds of the diffraction grating, whether the diffraction grating is disposed below or on the active layer 112 may be determined Electrodes 116, 117, 118, and 119 for injecting current and HR/AR coatings for adjusting sectional reflectance are formed on the active layer 112.

As shown in FIG. 9, connection between the active layer 112 and the passive waveguide 113 may uses a butt coupling method (directly connecting two optical waveguides) and an evanescent coupling method (using an adiabatic change of reflectance). Here, the butt coupling method requires controlling an internal reflectance that may occur at the sections of two waveguides (e.g., the active layer 112 and the passive waveguide 113).

In an embodiment, the bragg diffraction grating 115 may be formed on and below the active layer 112 through a holography technique and an electron beam lithography technique. Thereby, a gain change rate of the active layer 112 and a bragg wavelength change of the diffraction grating according to a temperature change may be controlled.

The dual wavelength laser according to an embodiment of the present invention may be applicable on a laser of oscillation wave length from 1.55 μm to 0.8 μm. Additionally, the dual wavelength laser is realized with a photomixer that efficiently absorbs oscillation wavelength, so that a micro-sized wideband frequency tunable terahertz transceiver may be developed.

FIGS. 10 through 15 are views illustrating a method of manufacturing the dual wavelength laser of FIG. 9. Referring to FIGS. 10 through 15, the method of manufacturing the dual wavelength laser is as follows.

Figure 10:
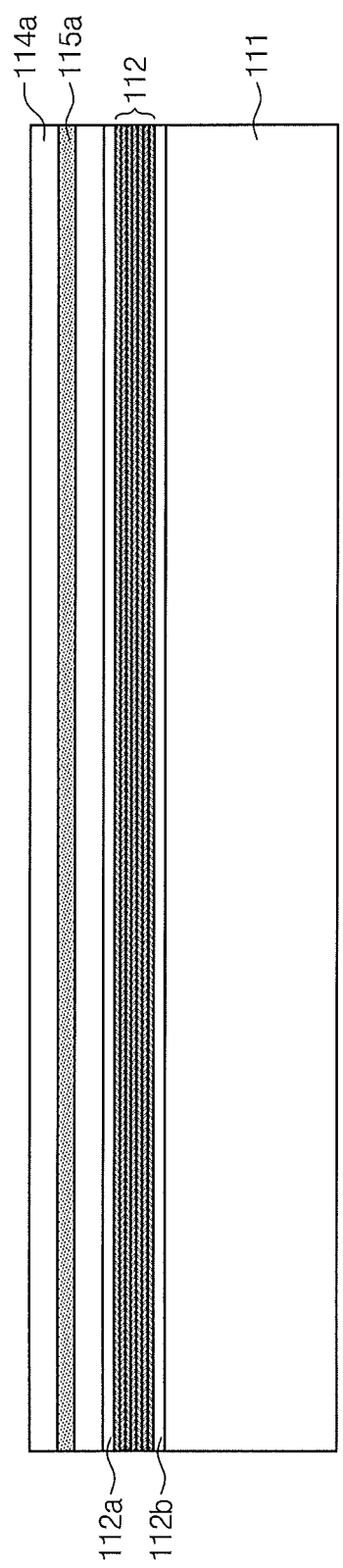

First, as shown in FIG. 10, a lower clad layer 111, an active layer 112 on the lower clad layer 111, and an InP clad layer 114a on the active layer 112 are sequentially stacked on an n-type InP substrate and a diffraction grating 115 is interposed between the InP clad layers 114a through a metal organic chemical vapor deposition (MOCVD) technique. Especially, a first separate confinement hetero layer 112a having a smaller band gap wavelength than the active layer 112 may be further interposed between the InP clad layer 114a and the active layer 112, and a second separate confinement hetero layer 112b having a smaller band gap wavelength than the active layer 112 may be further interposed between the active layer 112 and the lower clad layer 111.

Figure 11:
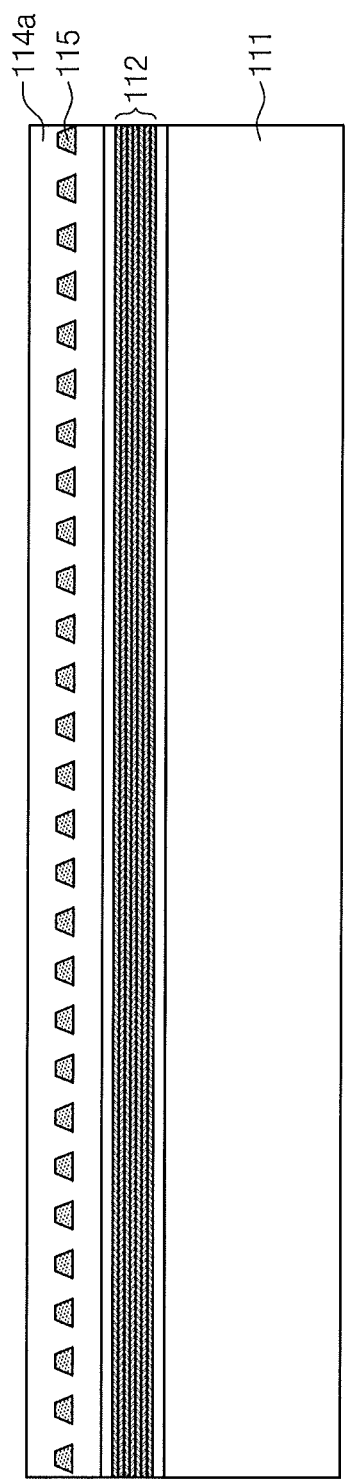

Thereafter, a shape such as the diffraction grating 115a shown in FIG. 11 is formed on the substrate through a holography technique or an electron beam lithography technique, and then through dry and wet etchings, the diffraction grating 115a is finally manufactured. After the manufacturing the diffraction grating 115a, a planarization process (refer to 114a) re-growing P-type InP to be thin is performed. When the diffraction gratings 115a are formed below the active layer 112, the above-mentioned process may proceed from a lower diffraction grating.

Figure 12:
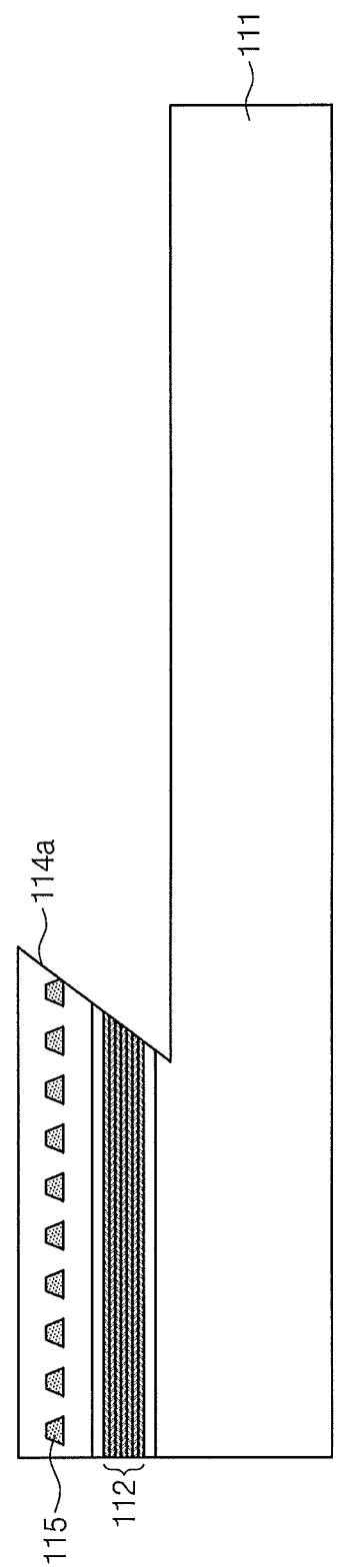

Next, as shown in FIG. 12, to allow a passive waveguide to be butt-coupled, a portion where the passive waveguide is integrated is etched in the active layer 112. After the integration of the passive waveguide, an angle and a shape are determined to reduce internal reflection that may occur in the section 113a.

Figure 13:
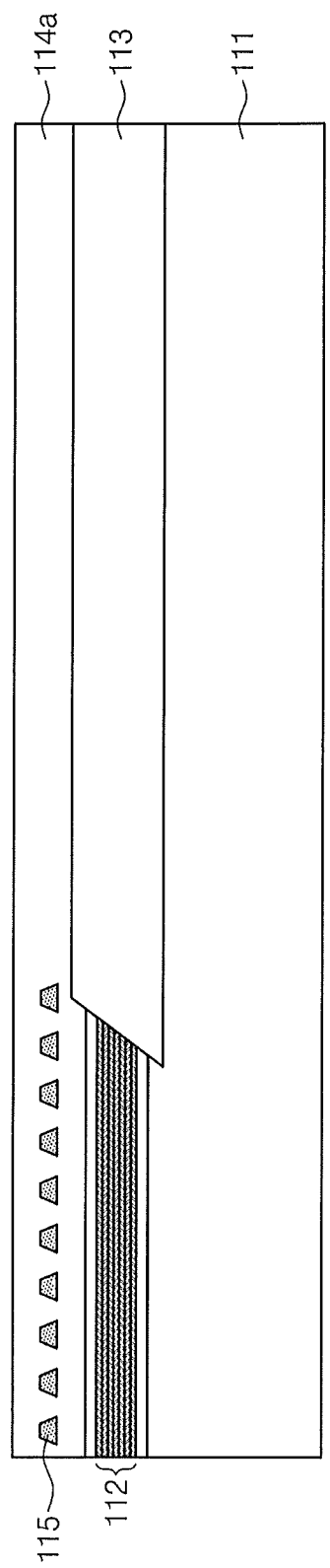

Later, as shown in FIG. 13, the passive waveguide 113 grows. Here, the passive waveguide 113 may use four-elements alloy (hereinafter, INGaAsP, λ=1.24 μm). At this point, the passive waveguide 113 may be any kinds of waveguides that may deliver optical signal generated from the active layer 112 without absorption. However, the passive waveguide 113 should proceed in a single mode.

Later, as shown in FIG. 14, the p-type InP clad layer 114b and the p-type InGaAs layer 116 grow. Here, the p-type InP clad layer 114a and the p-type InP clad layer 114b are called an upper clad layer 114. Here, the InGaAs layer 116 serves for easy current injection. Thereby, a DFB laser structure is completed.

Next, as shown in FIG. 15, processes for forming an electrode to apply current to the active layer 112 are performed. A lower electrode 117 is formed on the InGaAs layer 116 and an insulation layer 118 is formed on the lower electrode 117. Also, a microheater 119 is manufactured on the insulation layer 118 through a lithography method. In an embodiment, the manufactured microheater 119 is placed on the uppermost part of the dual mode wavelength laser.

Moreover, a bragg wavelength of the diffraction grating may vary. Various diffraction grating layers formed of InGaAs and InGaAsP may be used. The diffraction grating may be various kinds of diffraction gratings having high single wavelength occurrence efficiency, which are λ/4-shifted from a typical first diffraction grating type.

As mentioned above, a frequency tunable terahertz transceiver and a method of manufacturing a dual wavelength laser may be used for achieving microminiaturization and low manufacturing cost.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of manufacturing a frequency tunable terahertz transceiver including two separate distributed feedback lasers that are manufactured on one substrate, the method comprising:

forming a lower clad layer on the substrate;
forming an active layer on the lower clad layer;
forming an upper clad layer on the active layer;
interposing first and second diffraction grating layers between portions of the upper clad layer;
manufacturing a diffraction grating by etching the first and second diffraction grating layers;
integrating the active layer with a passive waveguide by etching a surface of the active layer to be slanted with respect to both vertical and horizontal directions, and butt-coupling the passive waveguide to the surface of the active layer so that a connection between the passive waveguide and the active layer is slanted with respect to both the horizontal and vertical directions; and
forming an electrode on the upper clad layer.

2. The method of claim 1, further comprising:
forming a first separate confinement hetero layer having a smaller band gap wavelength than that of the active layer between the active layer and the upper clad layer; and
forming a second separate confinement hetero layer having a smaller band gap wavelength than that of the active layer between the active layer and the lower clad layer.

3. The method of claim 1, wherein the manufacturing of the diffraction grating includes forming the diffraction grating through a holography and an electron beam lithography,
the method further comprising after the manufacturing of the diffraction grating, performing a planarization process to planarize the upper clad layer by re-growing the same material as the upper clad layer on the diffraction grating.

4. The method of claim 3, further comprising, after the integrating, growing a p-type semiconductor layer on the upper clad layer.

5. The method of claim 4, wherein the forming of the electrode comprises:
forming a lower electrode on the p-type semiconductor layer;
forming an insulation layer on the lower electrode; and
manufacturing a microheater on the insulation layer through a lithography technique.

6. The method of claim 1, further comprising:
generating an optical signal with the active layer;
oscillating the generated optical signal according to an effective refractive index of the diffraction grating;
outputting the optical signal from the active layer to the passive waveguide; and
outputting the optical signal from the passive waveguide into an optical device.

7. The method of claim 6, wherein the passive waveguide is tilted 9° to lower a sectional reflectance and increase optical coupling efficiency.

8. The method of claim 1, wherein each of the active layer and the passive waveguide is disposed between the lower clad layer and the upper clad layer.

9. The method of claim 1, wherein the diffraction grating is directly above the passive waveguide.

10. The method of claim 1, wherein the passive waveguide is directly coupled to an optical device.

11. The method of claim 1, wherein the passive waveguide includes two separate waveguides, and
the method further comprises receiving optical signals from the passive waveguides at a lens separately from each other; and
combining the optical signals and irradiating the combined optical signals on a photomixer.

* * * * *

UNITED STATES PATENT AND TRADEMARK OFFICE
CERTIFICATE OF CORRECTION

| | | |
|---|---|---|
| PATENT NO. | : 9,236,711 B2 | Page 1 of 1 |
| APPLICATION NO. | : 14/176838 | |
| DATED | : January 12, 2016 | |
| INVENTOR(S) | : Kyung Hyun Park | |

It is certified that error appears in the above-identified patent and that said Letters Patent is hereby corrected as shown below:

Title page, item 30 (Foreign Application Priority number)

Please change the listing Foreign Application Priority number to read as follows:

-- September 17, 2010  (KR)  10-2010-0091821 --

Signed and Sealed this
Twelfth Day of April, 2016

Michelle K. Lee
*Director of the United States Patent and Trademark Office*